United States Patent [19]
Wu et al.

[11] Patent Number: 5,645,977
[45] Date of Patent: Jul. 8, 1997

[54] METHOD OF MAKING MOLDS FOR MANUFACTURING MULTIPLE-LEAD MICROSTRUCTURES

[75] Inventors: Tung-Chuan Wu, Hsinchu; Jar-Sian Hsiau, Taipei; Min-Chieh Chou, Taipei; Jiing-Song Lu; Mu-Tien Liang, both of Hsinchu, all of Taiwan

[73] Assignee: Industrial Technology Research Institute, Hsinchu, Taiwan

[21] Appl. No.: 532,951

[22] Filed: Sep. 22, 1995

[51] Int. Cl.$^6$ .................................................. C25D 1/10
[52] U.S. Cl. ........................... 430/320; 205/70; 430/967
[58] Field of Search ................................ 430/320, 967; 205/70

[56] References Cited

U.S. PATENT DOCUMENTS

| | | | |
|---|---|---|---|
| 5,234,571 | 8/1993 | Noekes | 205/70 |
| 5,298,366 | 3/1994 | Iwasaki et al. | 430/320 |

*Primary Examiner*—John A. McPherson
*Attorney, Agent, or Firm*—W. Wayne Liaum

[57] ABSTRACT

A method for making molds for use in manufacturing multiple-lead microstructures is disclosed. Each of the molds comprises a set of punch head molds and a set of matching die plate molds, and the method comprises the steps of (a) dividing the multiple-lead microstructure into a plurality of portions, each portion is to be prepared by a pair of a punch head, which contains a plurality of prutrusions, and a die plate, which contains a plurality of matching recesses; (b) preparing each of the punch head molds using a first lithographic technique; and (c) preparing each of the die plate molds using a second lithographic technique. The first lithographic technique comprises the steps of: (i) forming a thick layer of a photoresist on a baseplate; (ii) irradiating an x-ray of ultraviolet ray onto the photoresist via a first photomask; (iii) developing the photoresist to remove undesired portion thereof; (iv) electroplating a metal or metal-ceramic composite material onto the photoresist that has been developed; (v) removing the photoresist to form a micromold having recesses matching the portion of the microstructure to be prepared. The second lithographic technique involves the same steps except a second photomask, which is conjugate to the first photomask, is used.

2 Claims, 16 Drawing Sheets

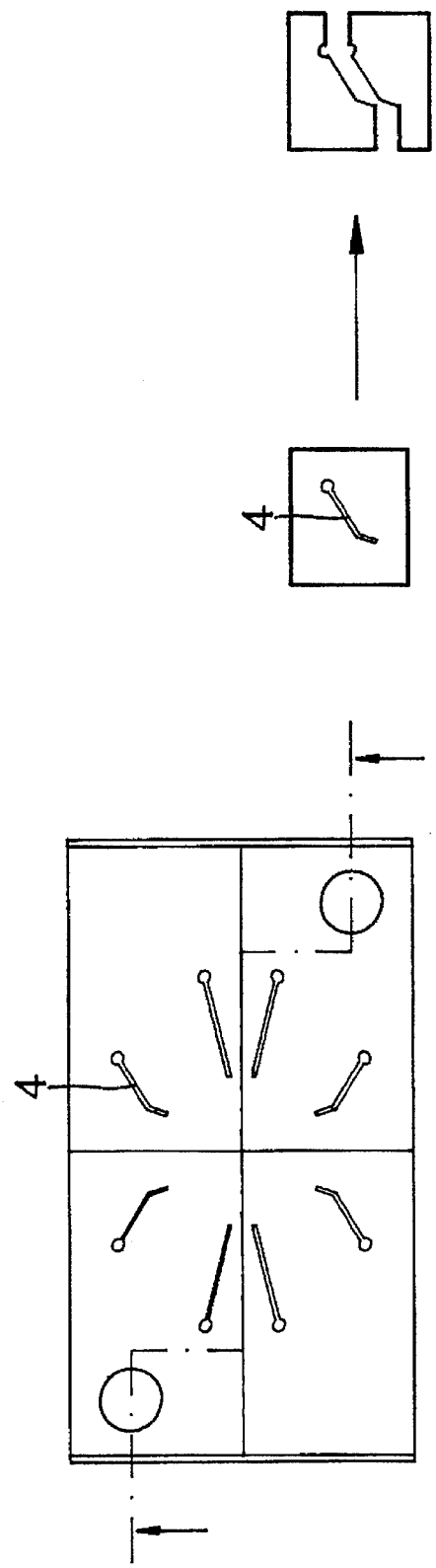

METHOD OF MAKING MOLDS FOR MANUFACTURING MULTIPLE-LEAD MICROSTRUCTURES

FIELD OF THE INVENTION

The present invention discloses a novel manufacturing method and mold device to quickly manufacture, in large scale, key microparts of mold such as punches, strippers, and die plates, etc. by use of energy beam, e.g. x-ray or ultraviolet rays lithographic technology, to resolve the problems that the traditional molds need to manufacture single pieces or relatives simple mold parts, then combine them to assemble the mold parts such as punches, strippers, and die plates, etc. required by to engineering stations.

BACKGROUND OF THE INVENTION

The traditional ways of manufacturing microparts' molds such as punches, pressboards, and dies are to make use of the methods of optical projective wheel grinding and wire cutting EDM (Electro-discharged Machining). When it comes to manufacturing the key microparts of punches, pressboards, and die plates, one must make use of the foregoing ways of machining to manufacture single pieces or relatively simple ones first, then assemble them to become molds of punches, strippers, and die plates which contain many microparts. But the molds manufactured by the traditional ways will increase the stresses of mold parts' machining and residual stresses which will affect the dimensional precision of the mold's part. In addition, the disadvantages of using the traditional way to manufacture parts with multiple lead's mold contain also: (a) having relatively large mold dimensions (b) requiring many more engineering manufacturing steps, i.e. high numbers of engineering stations (c) having less distributed number of legs per unit area, larger pitch between lead, and it is not easy to machine for microparts with high leg numbers, etc. (1) Owing to the foregoing disadvantages which are unfavorable to the production cost and delivery time, it, thereby, reduces the business competitiveness of the products.

The present invention discloses a new manufacturing method by use of energy beam: e.g. x-ray or ultraviolet rays lithographic technology, to manufacture mold parts with high precision microparts, such as punches, strippers, and die plates, etc. to overcome the disadvantages of traditional methods, so as to upgrade the micropart's precision of mold, increase the micropart's density, reduce the station number of engineering manufacturing, so that one can manufacture at a stretch, mold parts with multi-lead such as punches, strippers, and die plates, etc. within a single engineering manufacturing station, thereby, one not only reduces the production cost, but also effectively shortens the time of manufacturing molds so as to increase the competitive superiority of commercial products.

SUMMARY OF THE INVENTION

The purpose of the present invention is to find ways of manufacturing molds that traditionally one must first manufacture single microparts, and, afterwards, assemble these separate molds into punches, strippers, and die plates which contain a lot of microparts. FIG. 1 is the assemblage of a traditional punch head 1, a pressboard 2, and a die 3. One of the traditional ways of manufacturing parts of die plates and strippers, etc. is to employ wire cutting electro-discharge machining, as shown in FIG. 2a, or another way which cuts the molds, then forms machining by use of optical projective grinders, as shown in FIG. 2b, and finally combines into pressboards and dies, as shown in FIG. 2c. As the key micropart's guided hole 4 in the strippers and key micropart's punch hole 4, both are of the traditional machining forming, are very slender and small, the precision control is not easy. The machining shape is complicated and it is extraordinarily difficult to perform machining and is unable to increase its density. As a result, it increases the station number of engineering manufacturing. Also, owing to the fact that the residual stresses after machining are relatively larger, the mold's dimension precision will be reduced which results in lower density in lead number of formed mold. Traditionally, it can only manufacture microparts of single-shaped punches, as shown in FIG. 2d, where its top end with only 0.1 mm of minimum thickness is a curve shape 5, is very difficult to perform machining. There are keyways 6 near the bottom of the punches. When several molds finish machining, they are fixed into the keyway 6 by use of metal keys 9, as shown in FIG. 2e, where the thickness of the punch head's fixed board 8 is the height from the bottom of the punch to the bottom of the keyway. After the metal keys 9 penetrate through the keyways 6, screws are tightened in screw holes 7 to fix the fixed board into place.

In order to overcome the disadvantages of the traditional manufacturing technique, the present invention makes use of energy beam, such as a kind of x-ray or ultraviolet rays lithographic technology, called LIGA in short form, etc. The relevant manufacturing technology is illustrated as shown in FIG. 3. The first step of LIGA's manufacturing process, lithography, is to employ energy beam 4a such as x-ray or ultraviolet rays, etc. to expose a thick layer resist 2a, for example PMMS (polymethy/methaorylate), through a special Mask 3a. After the resist 2a, which is exposed and irradiated, is developed, one can obtain a required plastic mold plate. The second step, Electroforming, is to employ electroplating technology to electroplate the metal 5a, or metal-ceramic composite material, etc. onto this plastic mold plate. The third step, Micromolding, is to remove the plastic mold plate to obtain the required metal microstructure or injection mold. By use of the plastic mold injection and through the second electroplating or by use of the ceramic mold injection, or by slip casting, once again one can produce, in large scale, metal mold or ceramic mold parts. The advantages of employing energy beam, like ultraviolet rays or x-ray lithographic technology are as follows: (a) It can perform micro-machining (b) As it is made by a piece of Mask, its reproductivity of positional accuracy and dimensional accuracy are fairly good (c) It is good for mass production (d) It can perform machining for complicated shapes Hence, one can manufacture molds with many leads and with high precision by applying this manufacturing method which can effectively improve the traditional methods of manufacturing, which involves manufacturing the leads one by one, then combining them into shapes.

In the present invention, it first employs the LIGA's manufacturing method to form, at a stretch, mold pans having countless leads like punches, strippers, and die plates, etc. In general, the mold plate of high density microparts, as shown in FIG. 4a, by of this manufacturing method, comparing with those by use of traditional method, has density that can be several times higher (which is obvious in referring to FIG. 4a and FIG. 4b). The several individual molds formed by a similar way are finally combined into a set of punch molds with high precision punch molds. By use of the punch molds completed by employing this manufacturing method can quickly simplify and improve the process with traditional manufacturing working stations of more than twenty in number, as shown in FIG. 5, and change into only a few manufacturing stations, as shown in FIG. 8, saving time and lowering the cost. It is a great achievement to have this chief improvement and break-through in this kind of manufacturing method of formed molds.

DETAILED DESCRIPTION OF THE INVENTION

Figure 1:
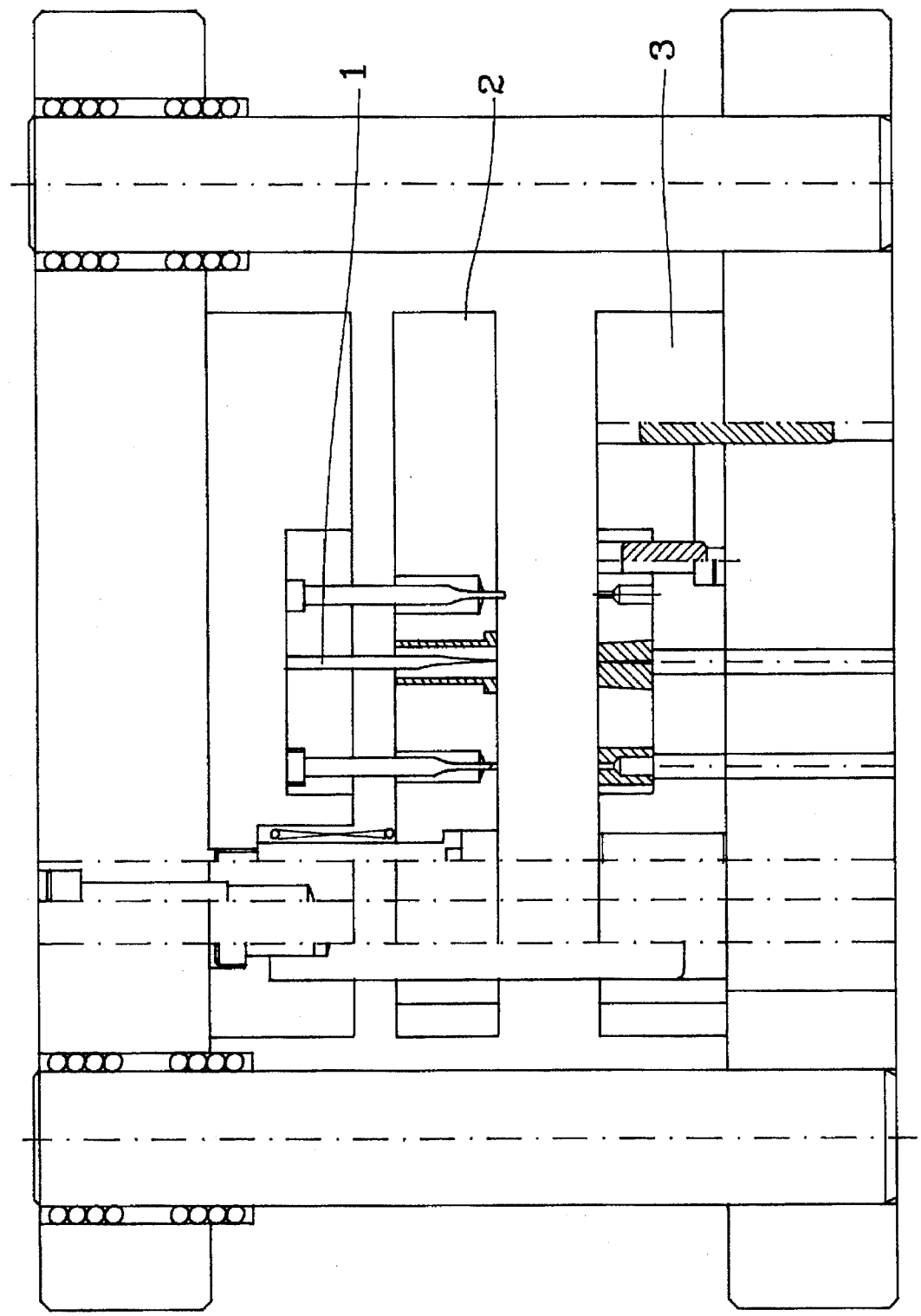
FIG. 1 is the schematic diagram of the traditional punching mold assembly.
Figure 2D:
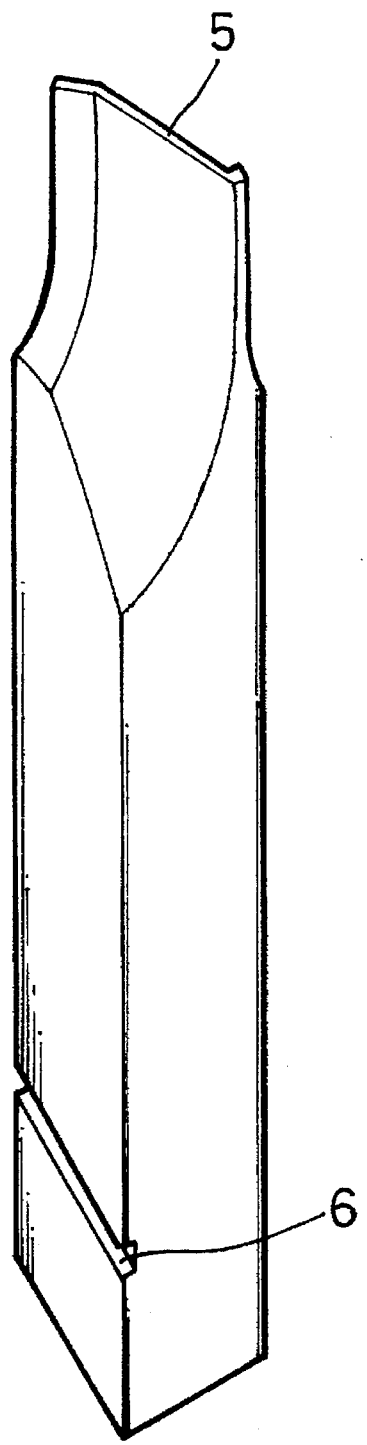
FIG. 2 is the schematic top view of the traditional punch die and stripper's punching mold.
Figure 2E:
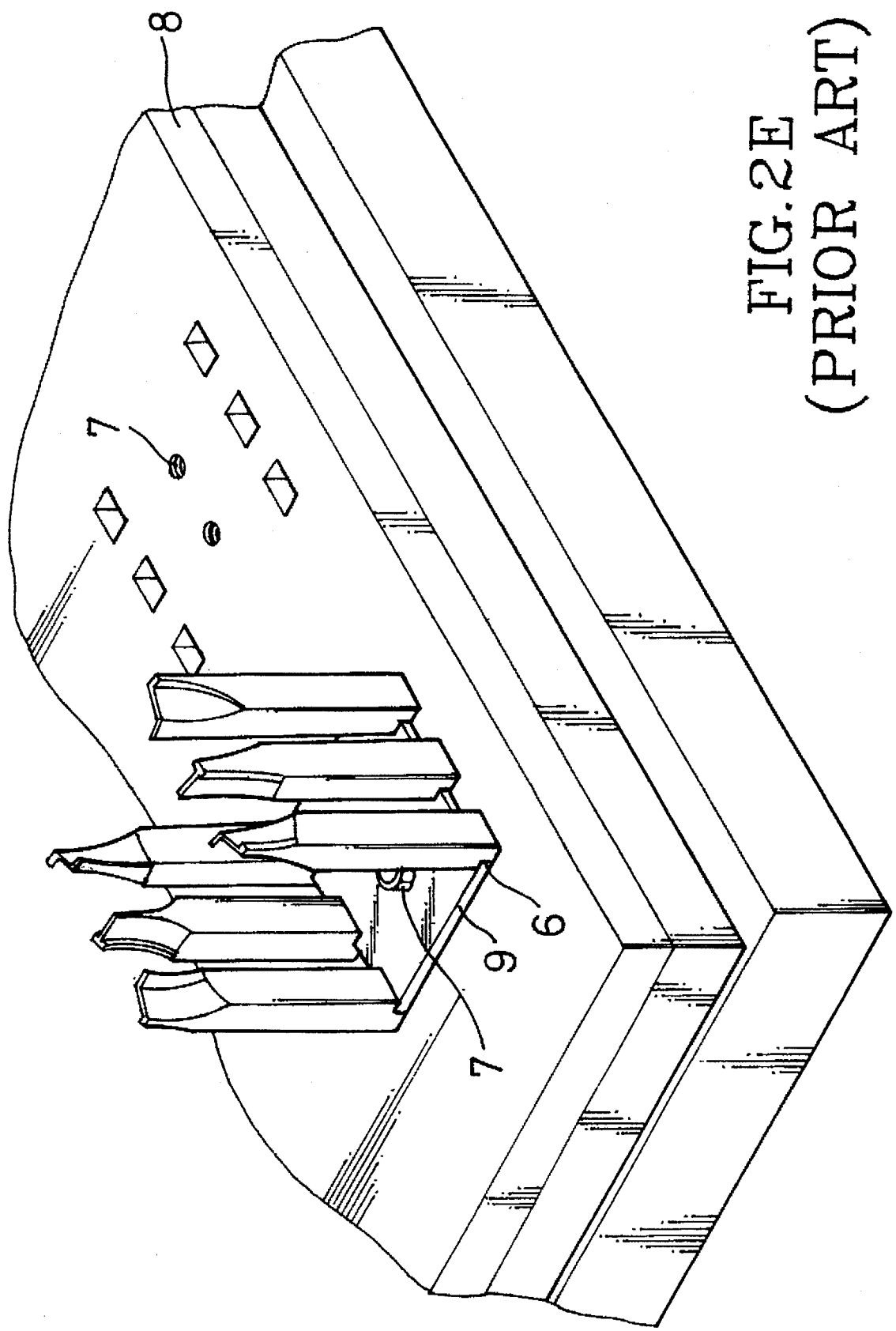
Figure 3A:
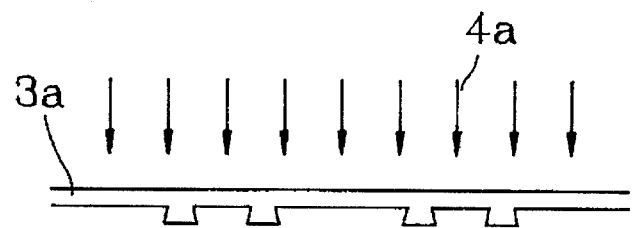
FIG. 3 is the schematic diagram of manufacturing flow chart of lithographic technology.
Figure 3B:
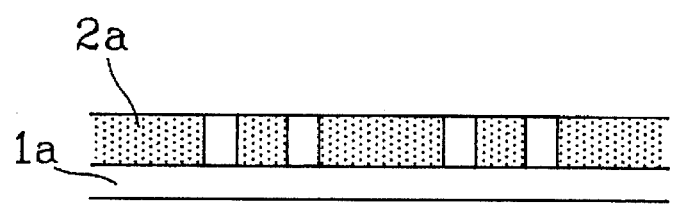
Figure 3C:
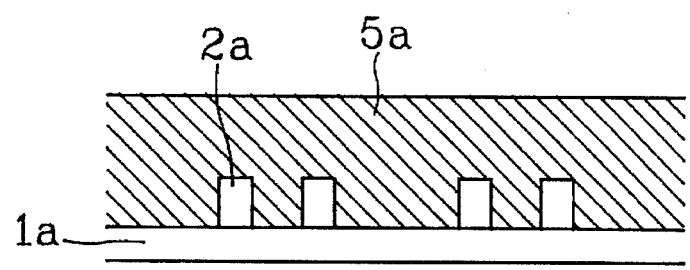
Figure 3D:
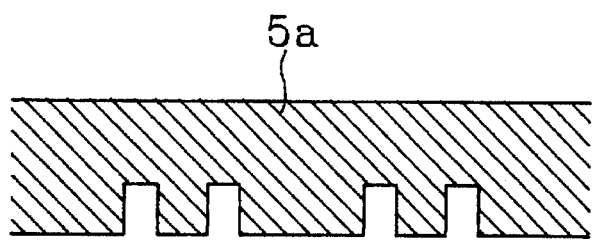
Figure 4B:
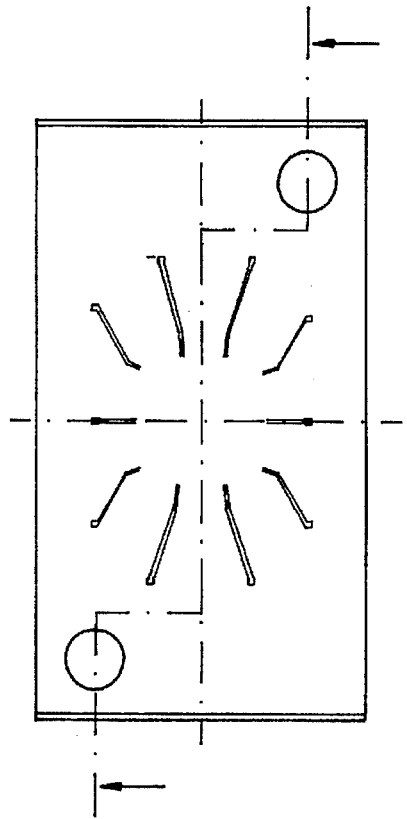
FIGS. 4A and 4B are the schematic top views of the present invention's and traditional manufacturing respectively, in punching molds used in die plates' and strippers' parts for comparison.
Figure 4A:
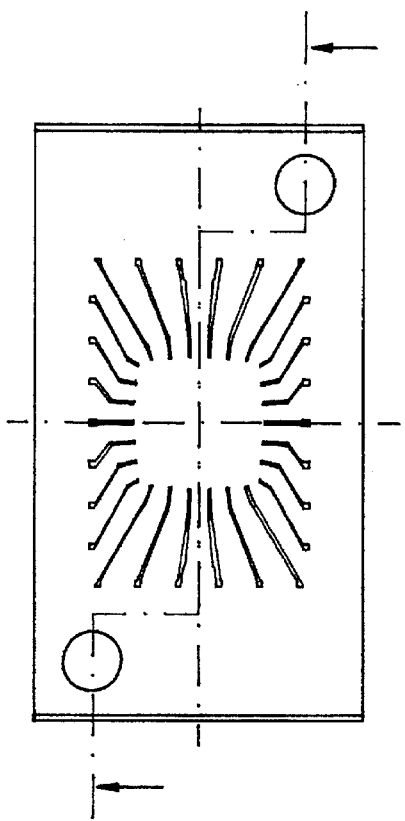
Figure 5:
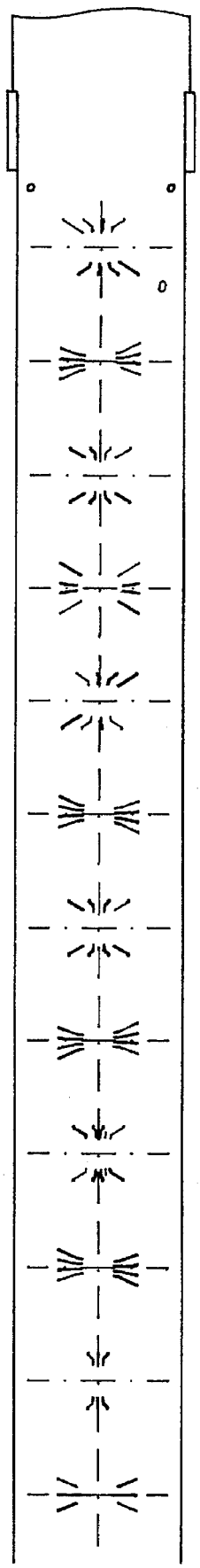
FIG. 5 is the schematic top view depicting the complicated manufacturing process of the first preferred embodiment of the traditional manufacturing method.
Figure 5:
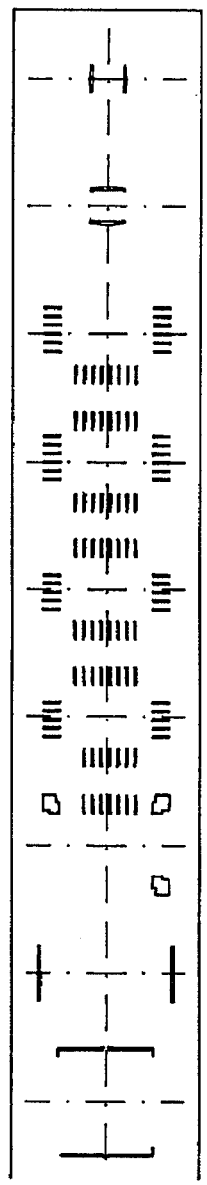
Figure 6A:
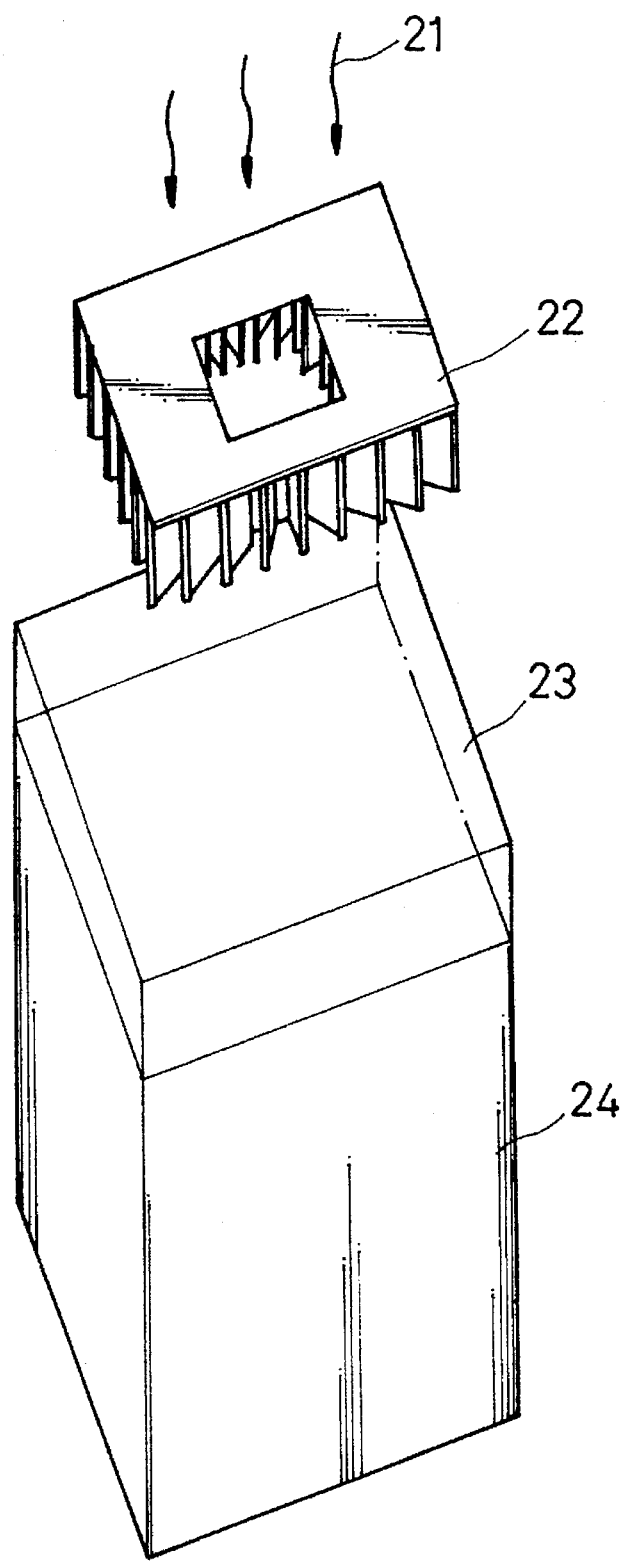
FIG. 6 is the schematic isometric drawing of a series of manufacturing processes by use of LIGA technology to manufacture stripper's dies or punch heads which illustrate the first preferred embodiment of the present invention.
Figure 6B:
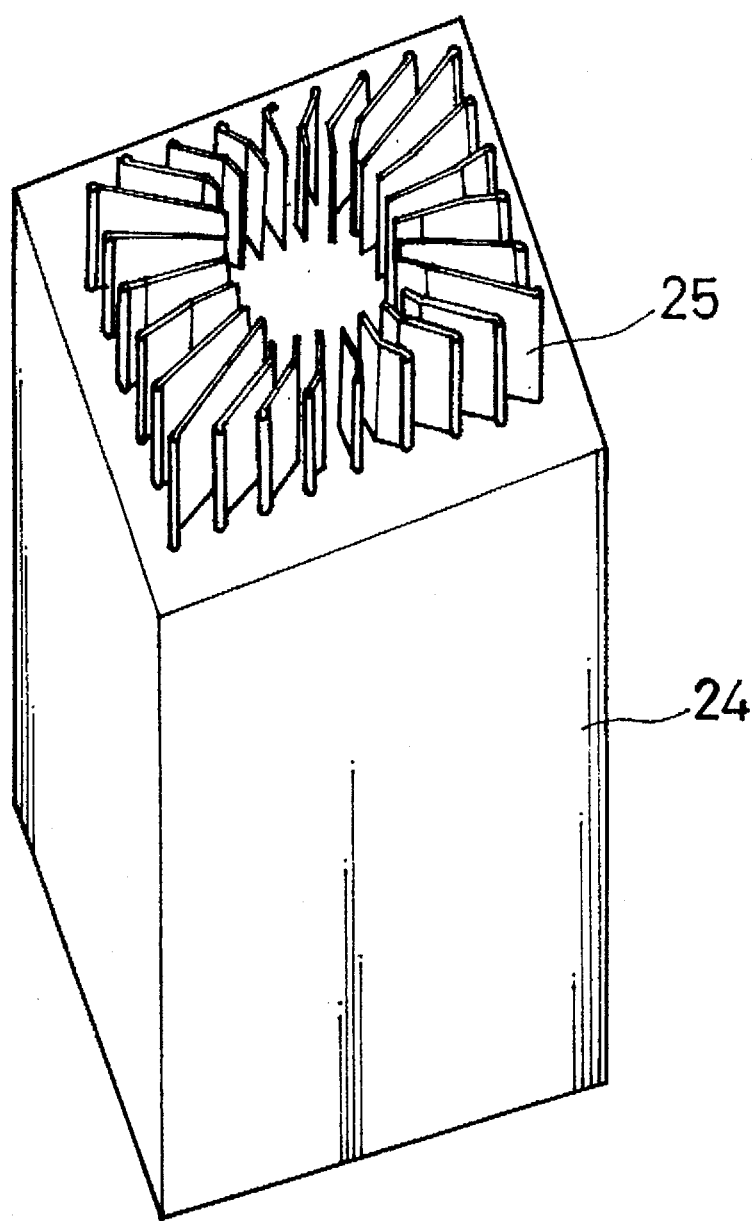
Figure 6C:
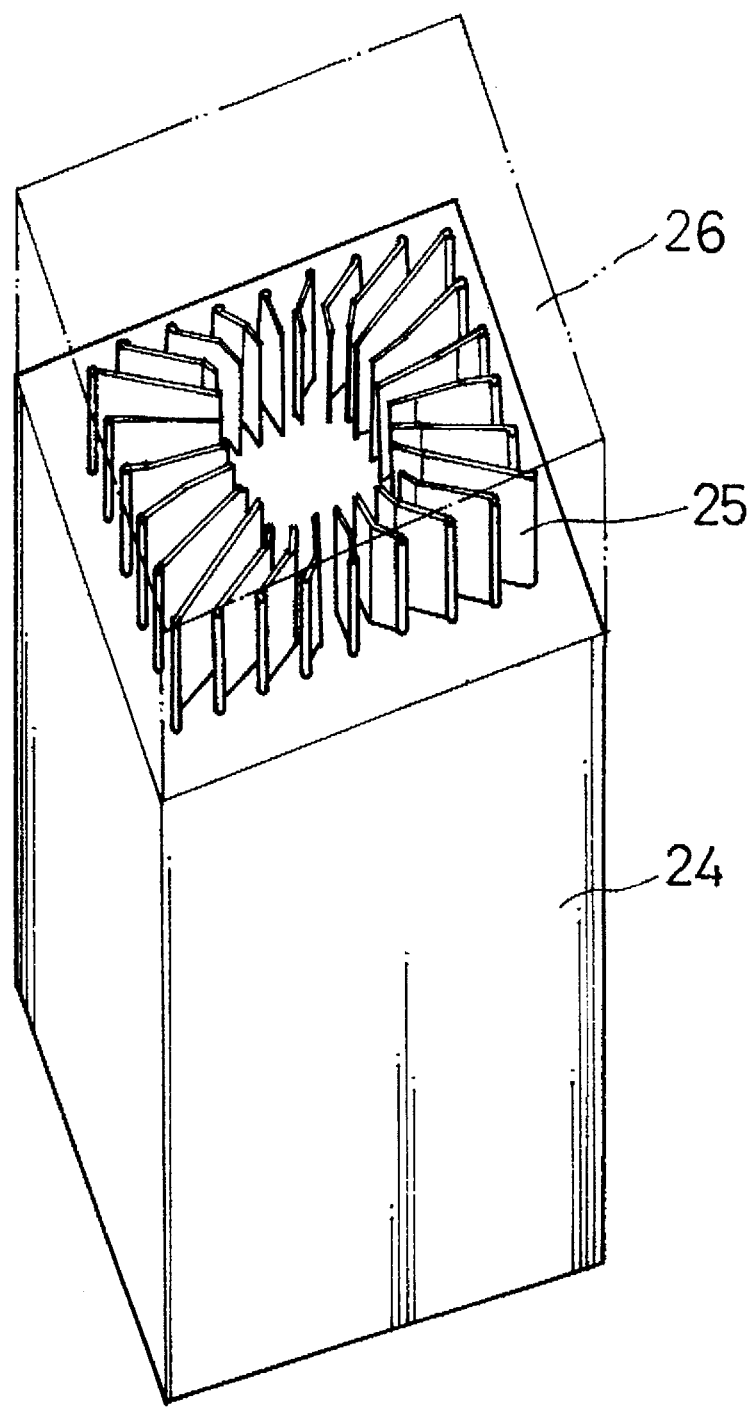
Figure 6D:
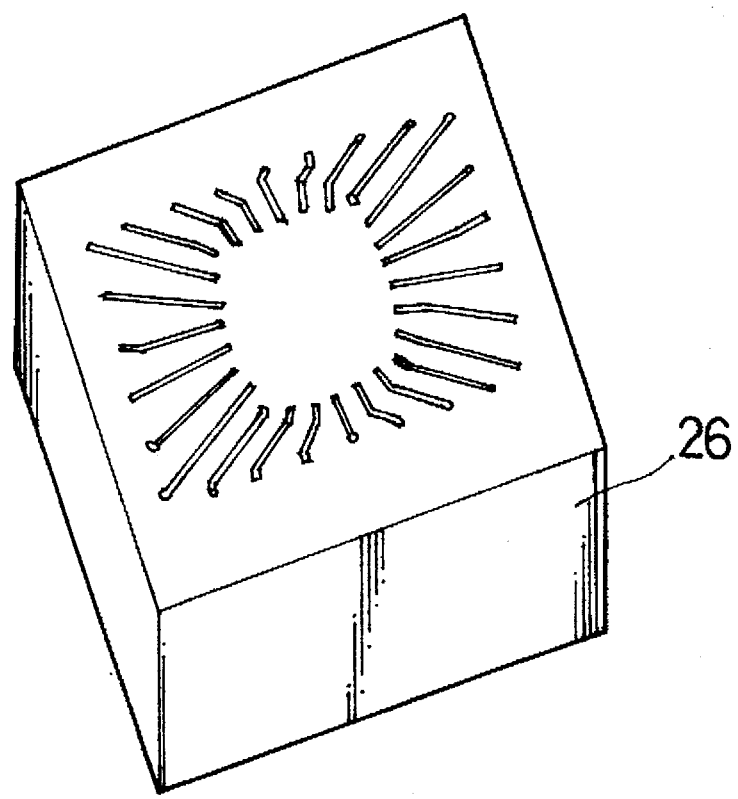
Figure 6E:
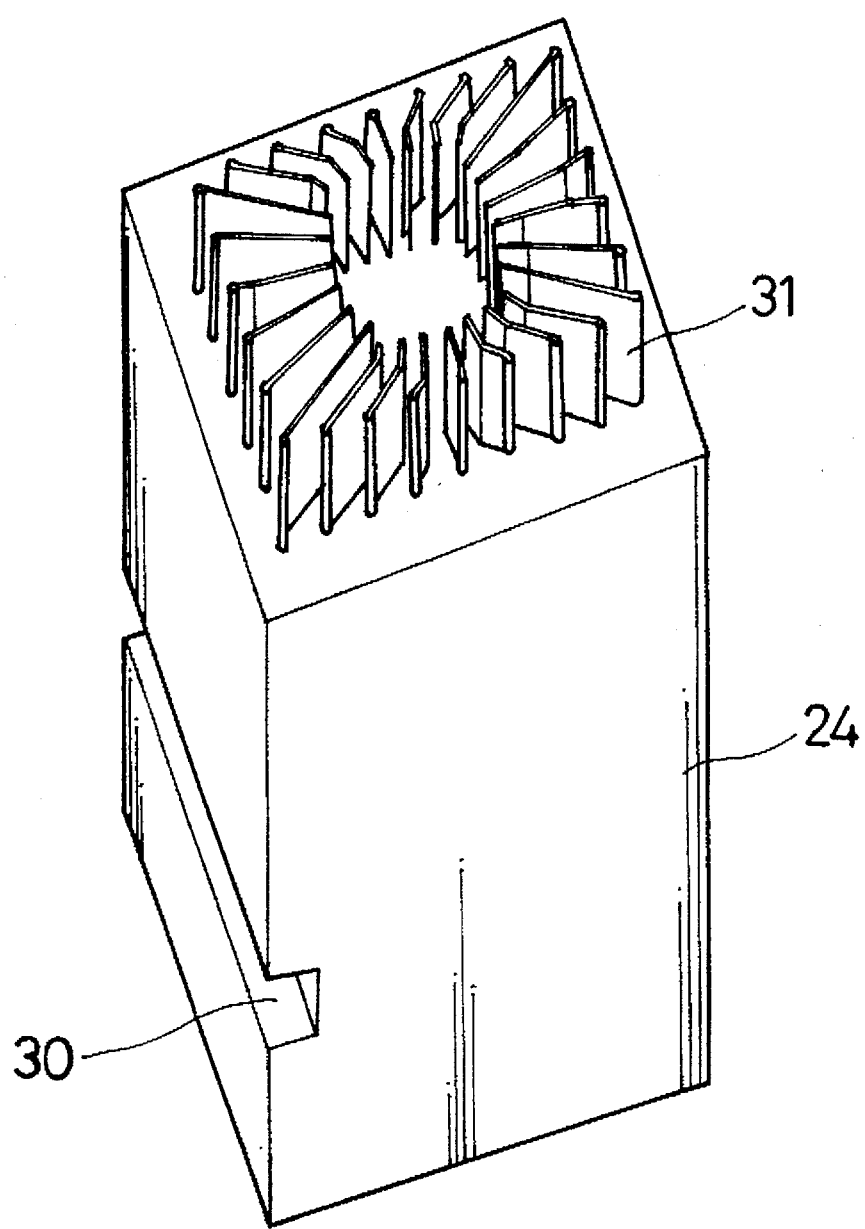
Figure 7A:
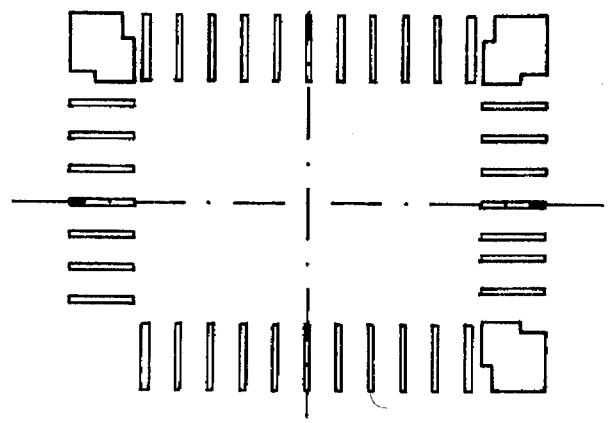
FIG. 7 is the schematic top view showing the manufacturing of different x-ray Mask patterns.
Figure 7B:
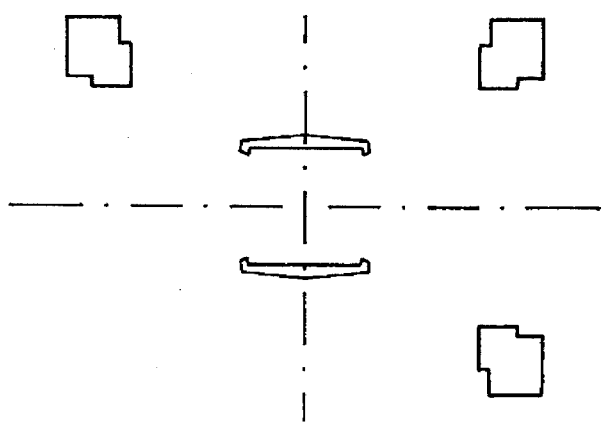
Figure 7C:
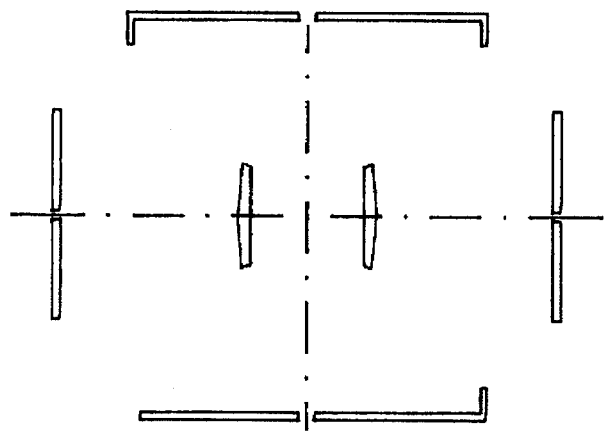
Figure 8:
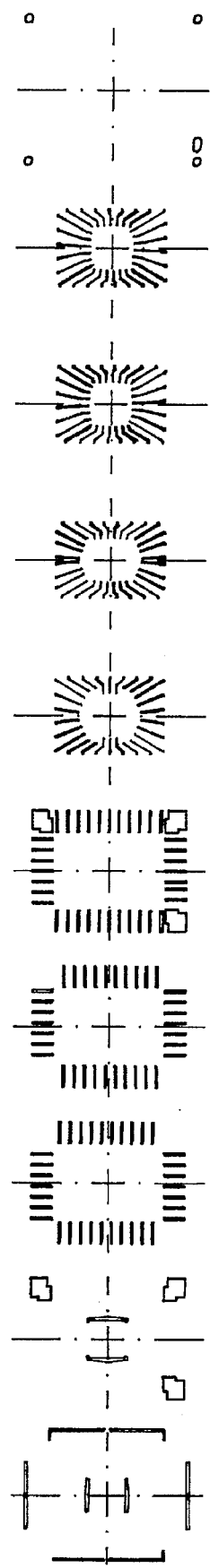
FIG. 8 is the schematic diagram showing a series of punching processes and step by step use of the present invention's technique to manufacture mold to illustrate the present invention's first preferred embodiment.

Please refer to FIG. 6 which shows the schematic diagram of a series of manufacturing processes by use of LIGA's technique to manufacture a pressboard of the present invention, wherein the method used is to manufacture key microparts of mold. The manufacturing process consists of using elements like x-ray 21 (or light source of ultraviolet ray), Mask 22, resist 23, base plate 24, and electroforming metal 26, etc. (please refer to FIG. 6A through 6D). First of all, manufacture the required Mask style in accordance with the shape of strippers or die plates (the Mask 22 is shown in FIG. 6A), then lay out a thick layer of resist 23 on the base plate 24, to which one irradiates through Mask 22 by x-ray 21 (or ultraviolet ray). Afterwards, we can obtain a plastic mold plate 25 required through developing the resist 23 which was irradiated as shown in FIG. 6B, then electroplate the electroforming metal 26 in this plastic mold plate 25 by use of the electroforming technique. Thereafter, to remove the plastic mold plate 25, as shown in FIG. 6c, to obtain the pressboard's mold, then, from the plastic mold plate 25 manufactured by this mold and through the second times electroplating, one can perform large scale production of strippers or die plates of multi-lead metal microstructure as shown in 6D. By use of the same method, design moreover, different x-ray Mask patterns, as shown in FIG. 7A, 7B, and 7C then use these patterns as Mask patterns, employ the lithographic technique LIGA's manufacturing process which consists of the same steps as mentioned above, only to change the previous Mask's pattern into the Mask's pattern as those of FIG. 7A, 7B, and 7C, repeats the LIGA's manufacturing steps. Finally, also obtain die plates or strippers of multi-lead metal microstructure (the mold plate's structures are shown in FIG. 7A or FIG. 7B or FIG. 7C). The rest of the mold plates of cable-tray multi-leg metal microstructures (as shown in FIG. 8) are also microstructures by the LIGA method. The manufacturing method of punch head is the same as mentioned above, only that the shape of the Mask is opposite to either of the strippers or of the die plates which are convex in shape (male mold) while the Masks of the punch head are concave in shape (female mold) wherein the keyway 30 is fixed by the fixed plate. The punch head 31 is the one that contains a lot of microforming, as shown in FIG. 6E, which is the punch head required by the single engineering stations. The remaining punch heads required by the cable-tray multi-lead metal microstructure (as shown in FIG. 8) are also formed by the same way to complete the entire punch heads comprising a large number of microforms that are required by all the punch molds by only changing the shape of the Mask.

Figure 9:
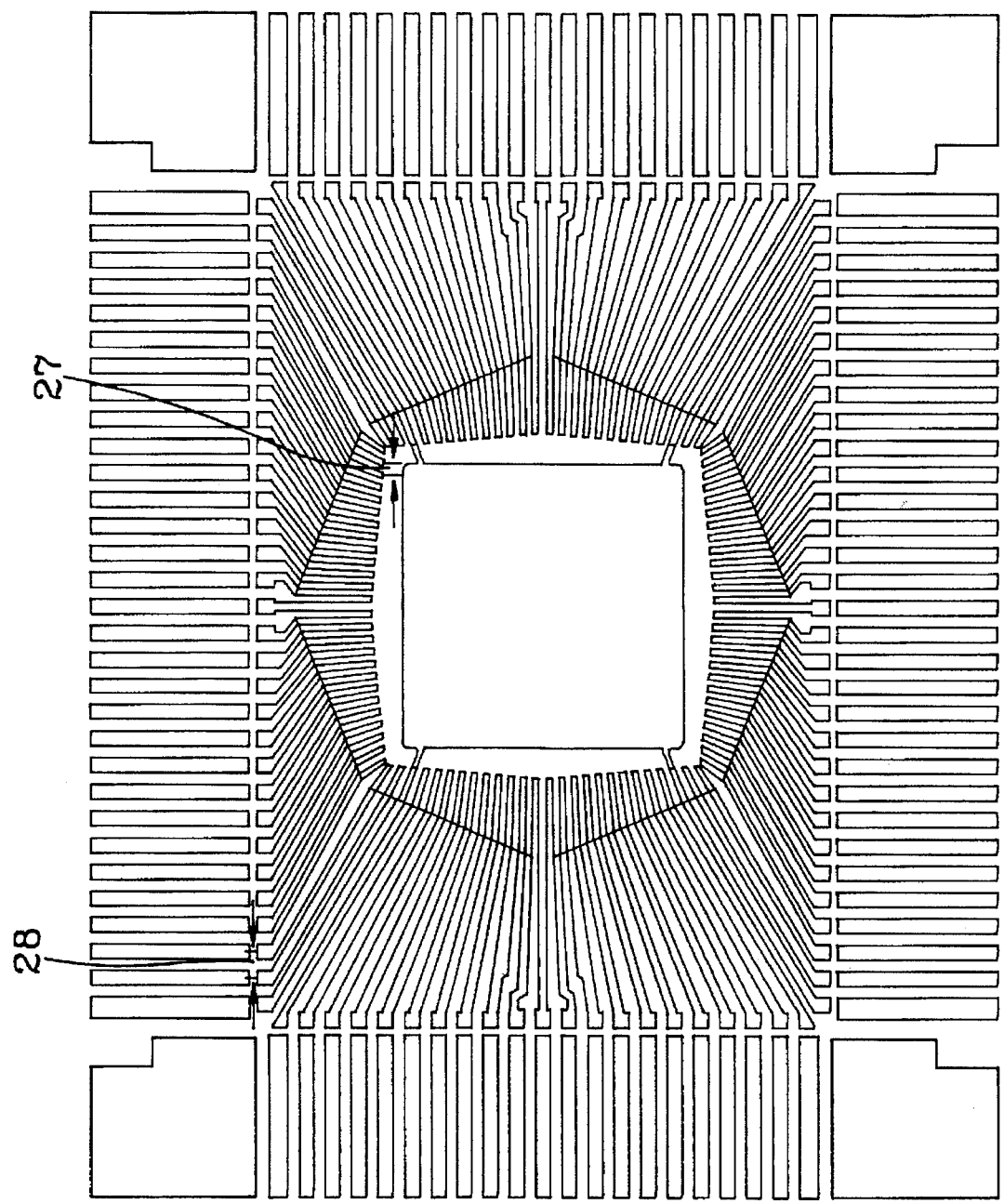
FIG. 9 is the schematic diagram showing the micropart drawing manufactured by the mold of the new manufacturing process to illustrate the first preferred embodiment of the present invention.

Please refer again to FIG. 9 which is the cable-tray punched product manufactured by means of x-ray 21 (or ultraviolet ray) and employing the LIGA method. Its structure consists of inner-lead pitch 27, outer-leg pitch 28, etc. wherein the pitch 27 of the inner-lead is around 0.2 mm and the pitch 28 of the outer-lead is below 0.5 mm. The shape precision of the profile machining at the lead connection part is greater than and equal to 0.002 mm. The applied length of the lead connection profile at the part of the punch head is greater than and equal to 2 mm. The applied length of the lead connection profile at the part of the die is greater than and equal to 0.5 mm and its shape precision is smaller than and equal to 0.001 mm.

Figure 10:
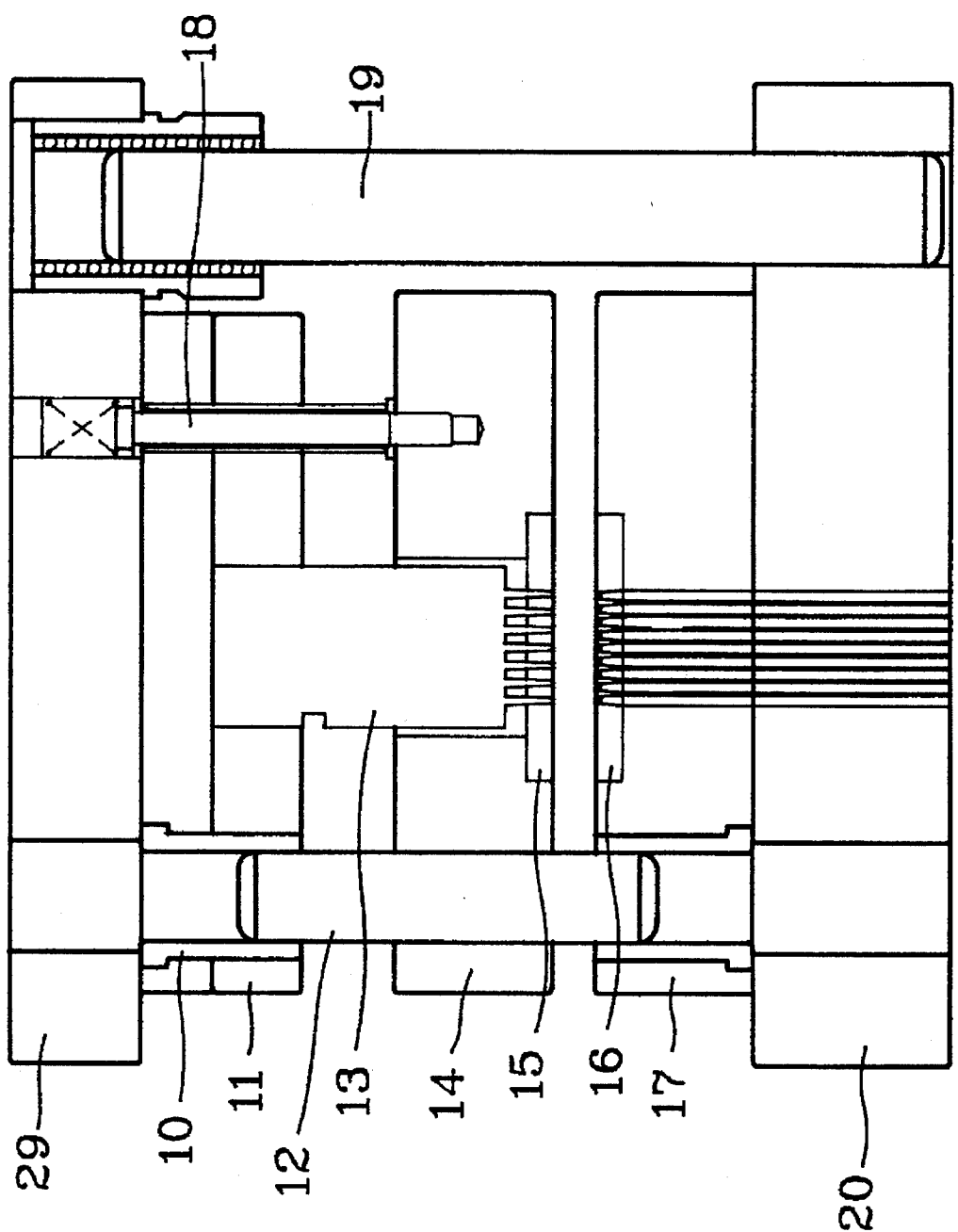
FIG. 10 is the schematic diagram showing the section view of the mold assembly of the new manufacturing process to illustrate the first preferred embodiment of the present invention.

FIG. 10 shows the drawing of an assembled mold through the composition of punch heads 13, a stripper 15, and die plates 16 by use of the manufacturing process using x-ray 21 (or ultraviolet ray). Its parts consist of die set plate 29, punch back plate 10, punch holding plate 11, sub-guided post 12, punch 13, stripper back plate 14, stripper 15, die back plate 17, combined member with fixed interval 18, primary guided post 19, die seat plate 20, etc. wherein the stripper 15 and die plate 16 are manufactured by use of the LIGA method and are tight-fitted and pressed into the stripper back plate 14 and die back plate 17 and the punch head manufactured by going with and by means of the foregoing method wherein the minimum thickness of the punch head can be as small as 0.1 mm. Due to the minute characteristic of having high precision of punch 13, stripper 15, and die plate 16, the punching gap between the punch head and die plate can be within 0.2 mm.

According to the foregoing embodiments, one who is familiar with this kind of technique can make some changes and modifications, therefore, it is not appropriate to limit the range of the patent application of the present invention by the embodiments described by the present invention.

What is claimed is:

1. A method for making molds for use in manufacturing multiple-lead micro structures, wherein each of said molds comprises a set of punch head molds and a set of matching die plate molds, and said method comprises the steps of:

(a) dividing said multiple-lead microstructure into a plurality of portions, each portion is to be prepared by a respective pair of a punch head, which contains a plurality of protrusions, and a die plate, which contains a plurality of matching recesses;

(b) preparing each of said punch head molds using a first lithographic technique; and (c) preparing each of said die plate molds using a second lithographic technique;

(d) further wherein said first lithographic technique comprises the following steps:
  (i) forming a thick layer of a photoresist on a baseplate;
  (ii) irradiating an x-ray or ultraviolet ray onto said photoresist via a first photomask;
  (iii) developing said photoresist to remove undesired portion thereof;
  (iv) electroplating a metal or metal-ceramic composite material onto said photoresist that has been developed;
  (v) removing said photoresist to form a micromold having recesses matching said portion of said microstructure to be prepared; and (d) said second lithographic technique comprises the following steps:

(i) forming a thick layer of a photoresist on another baseplate;
  (ii) irradiating an x-ray or ultraviolet ray onto said photoresist via a second photomask, which is a conjugate of said first photomask;
  (iii) developing said photoresist to remove undesired portion thereof;
  (iv) electroplating a metal or metal-ceramic composite material onto said photoresist that has been developed;
  (v) removing said photoresist to form a micromold having protrusions matching said portion of said microstructure to be prepared.

2. The method for making molds for use in manufacturing multiple-lead microstructures according to claim 1 which further comprises the step of forming a keyway near a top end of said punch head so to fix said punch head to a holding plate.

* * * * *